United States Patent [19]

Tsuji

[11] Patent Number: 4,927,619
[45] Date of Patent: May 22, 1990

[54] DIAMOND SINGLE CRYSTAL

[75] Inventor: Kazuo Tsuji, Hyogo, Japan

[73] Assignee: Sumitomo Electric Industries, Ltd., Osaka, Japan

[21] Appl. No.: 255,249

[22] Filed: Oct. 11, 1988

Related U.S. Application Data

[60] Continuation-in-part of Ser. No. 733,541, Jun. 12, 1985, abandoned, which is a division of Ser. No. 506,935, Jun. 22, 1983, Pat. No. 4,544,540.

[30] Foreign Application Priority Data

Jun. 25, 1982 [JP]  Japan ................... 57-110398
Aug. 13, 1982 [JP]  Japan ................... 57-141505

[51] Int. Cl.$^5$ ............................................. C01B 31/06
[52] U.S. Cl. ............................ 423/446; 136/DIG. 68
[58] Field of Search .............. 423/446; 136/DIG. 68; 59/86

[56]  References Cited

U.S. PATENT DOCUMENTS

| | | | |
|---|---|---|---|
| 3,083,080 | 3/1963 | Bovenkerk | 423/446 |
| 3,297,407 | 1/1967 | Wentorf | 423/446 |
| 3,310,501 | 3/1967 | Darrow et al. | 423/446 |
| 3,423,177 | 1/1969 | Bovenkerk | 423/446 |
| 3,949,062 | 4/1976 | Verschagin et al. | 423/446 |
| 4,036,937 | 7/1977 | Ray et al. | 423/446 |
| 4,122,636 | 10/1978 | Ray et al. | 423/446 |
| 4,333,986 | 6/1982 | Tsuji et al. | 423/446 |
| 4,412,980 | 11/1983 | Tsuji et al. | 423/446 |
| 4,425,315 | 1/1984 | Tsuji et al. | 423/446 |

OTHER PUBLICATIONS

Bovenkerk III, Some Observations on the Morphology and Physical Characteristics of Synthetic Diamonds, The American Mineralogist, vol. 46, Jul.-Aug. 1961, pp. 952-963.

*Primary Examiner*—John Doll
*Assistant Examiner*—Robert M. Kunemund
*Attorney, Agent, or Firm*—Sughrue, Mion, Zinn, Macpeak & Seas

[57]  ABSTRACT

An artificial diamond single crystal, at least a part of a surface of the crystal having a rough surface which diffusibly reflects light which is formed by suppressing crystal growth at that surface, and wherein said diamond single crystal is obtained by:

providing a diamond synthesis reaction system comprised of a reaction chamber housing having positioned therein a carbon source and a solvent metal arranged in contact with the said carbon source, said reaction system being arranged in a pressure medium;

providing a seed crystal in the reaction chamber;

providing temperatures of from about 1300° to 1600° C. and pressure of from about 50 to 60 Kb in the reaction chamber which permit diamond to be maintained thermodynamically stable in the reaction chamber housing;

heating the reaction chamber to provide a temperature gradient in such a way that a portion of the solvent metal in contact with the carbon source is higher in temperature than a portion of the solvent metal in contact with the seed crystal so as to migrate the carbon from the higher temperature portion to the lower temperature portion using the solvent metal as a medium; and allowing the carbon to precipitate and grow as a diamond on the seed crystal due to the difference in solubility caused by the temperature gradient in the reaction chamber housing;

the crystal growth being maintained for about 10 to 100 hours until the crystal growth in the reaction chamber housing in at least one direction perpendicular to the direction of the temperature gradient reaches the contact surface of the solvent metal with the pressure medium having an irregular rough surface and thereby the crystal growth is suppressed at the surface of the pressure medium to thereby form an irregular rough surface on the crystal.

15 Claims, 5 Drawing Sheets

DIAMOND SINGLE CRYSTAL

RELATED U.S. APPLICATION DATA

This application is a continuation in part application of Ser. No. 733,541, filed June 12, 1985, now abandoned which is a division of Ser. No. 506,935, filed June 2, 1983, now U.S. Pat. No. 4,544,540.

FIELD OF THE INVENTION

The present invention relates to an artificial diamond single crystal having a rough surface which is suitable for use in tools, and a process for manufacturing such a crystal.

BACKGROUND OF THE INVENTION

Bit for drilling rocks and tip material of dressers for repairing grinding wheels have been made of diamond which has the highest hardness of all materials. Diamonds used in these tools must be approximately 1 mm or more in size. Natural diamond called "boart" is used at present since synthetic diamonds having such a size have not been manufactured on an industrial scale.

The resistance to wear of a diamond varies to a great extent depending upon the orientation of crystals and it is essential in the use of these tools to select a proper orientation. On the other hand, natural diamonds are scarcely idiomorphic because of their being subjected to dissolution in the process of growth. Generally, natural diamonds have been rounded, and have a variety of shapes depending upon the degree of dissolution. As a result, it requires considerable skill to determine the proper orientation of crystals which can serve as tools.

SUMMARY OF THE INVENTION

An object of the present invention is to increase the adhesive strength of a diamond single crystal to a tool support by providing the crystal with a novel surface condition.

Another object of the present invention is to provide a diamond single crystal having a shape suited for tools.

Another object of the present invention is to provide a rodlike diamond single crystal having a sufficient length for use in a tool.

The artificial diamond single crystal of the present invention is characterized in that at least a part of the surface of the crystal has a rough surface which was formed by suppressed crystal growth at that surface.

In particular, the present invention provides an artificial diamond single crystal, at least a part of a surface of the crystal having a rough surface which diffusibly reflects light which is formed by suppressing crystal growth at that surface, and wherein the diamond single crystal is obtained by:

providing a diamond synthesis reaction system comprised of a reaction chamber housing having positioned therein a carbon source and a solvent metal arranged in contact with the carbon source, the reaction system being arranged in a pressure medium;

providing a seed crystal in the reaction chamber;

providing temperatures of from about 1300° to 1600° C. and pressure of from about 50 to 60 Kb in the reaction chamber which permit diamond to be maintained thermodynamically stable in the reaction chamber housing;

heating the reaction chamber to provide a temperature gradient in such a way that a portion of the solvent metal in contact with the carbon source is higher in temperature than a portion of the solvent metal in contact with the seed crystal so as to migrate the carbon from the higher temperature portion to the lower temperature portion using the solvent metal as a medium; and allowing the carbon to precipitate and grow as a diamond on the seed crystal due to the difference in solubility caused by the temperature gradient in the reaction chamber housing;

the crystal growth being maintained for about 10 to 100 hours until the crystal growth in the reaction chamber housing in at least one direction perpendicular to the direction of the temperature gradient reaches the contact surface of the solvent metal with the pressure medium having an irregular rough surface and thereby the crystal growth is suppressed at the surface of the pressure medium to thereby form an irregular rough surface on the crystal.

The diamond single crystal of the present invention can be formed by the following preferred method.

The disclosed process for manufacturing a diamond single crystal involves a diamond reaction system consisting of a carbon source, a solvent metal (molten catalyst metal) arranged in contact with said carbon source, and a seed crystal. The reaction system is held under elevated pressures and temperatures which permit diamond to be maintained in thermodynamically stable condition. The reaction chamber housing the reaction system is heated to provide a temperature gradient in such a way that the portion of the solvent metal in contact with the carbon source is higher in temperature than the portion of the solvent metal in contact with the seed crystal so as to migrate the carbon from the higher temperature portion to the lower temperature portion using the solvent metal as a medium. Accordingly, the carbon is precipitated and grows as diamond on the seed crystal due to the difference in solubility of carbon caused by said temperature gradient. The diamond single crystal of this invention is manufactured under the condition that the crystal growth in at least one direction perpendicular to the direction of the temperature gradient (i.e., to the longitudinal direction) is suppressed at the end of the solvent metal. In the present invention the crystal growth suppression is carried out by using a solvent metal having a shape of the cross section perpendicular to the direction of the temperature gradient such that the crystal growth in the direction of the cross section plane suppressed at the solvent metal surface (the outer surface) due to insufficient size of the solvent metal in this direction.

BRIEF DESCRIPTION OF THE DRAWINGS

FIGS. 10(a),(b), 11, 12 and 13 are schematic illustrations showing examples of rodlike diamonds of this invention.

FIGS. 22a–25c are schematic views of diamond crystals of the invention and cross-sectional views thereof.

DETAILED DESCRIPTION OF THE INVENTION

Figure 14:
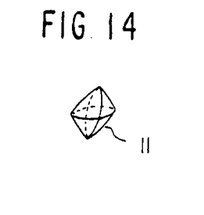
FIG. 14 is a perspective view of a natural diamond.
Figure 15:
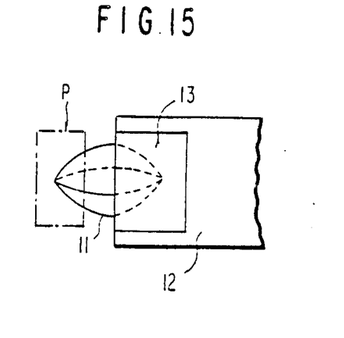
FIG. 15 is a cross-sectional view of the conventional dresser using a diamond shown in FIG. 14.

Generally, a natural diamond has a diameter almost equal to its length as shown in FIG. 14, with its entire configuration close to that of a sphere. In addition, the surfaces are smooth, and the edges which serve as knives when sued in tools are rounded because it has been subjected to dissolution in the process of growth as described hereinabove. For this reason, when a natural diamond is used in a dresser a particular type of diamond tools nearly half of it is embedded in the cementing material on its support as shown in FIG. 15, so that the usable portion becomes very small (only the tip portion p in FIG. 15 can be used). Furthermore, since the surfaces are smooth as described above, the adhering strength to the cementing material is weak. Accordingly, it may fall off during use. In FIG. 15, reference numerals 11, 12, and 13 designate a natural diamond, a support, and a cementing material, respectively.

Further, in diamond bits used for drilling, there exists a problem that the bits lose their sharpness with progressing wear, resulting in increase of weight on bit. In addition, the adhering strength of the diamonds to the bit body is weak because only about half of each diamond is embedded in the bit body due to its nearly spherical shape, the surfaces are comparatively smooth, and because they are mounted to the bit body by powder metal method they are apt to fall of during drilling.

The present invention provides diamond dressers and bits which solve the problems encountered with the conventional ones by using the synthetic diamonds of the present invention therein.

The diamond single crystal of the present invention, the process for manufacturing them, and the diamond tools using them will be described below with reference to the accompanying drawings.

Figure 1:
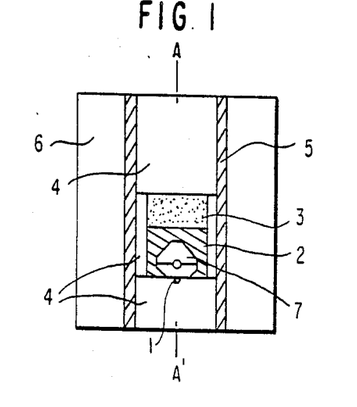
FIG. 1 is a longitudinal sectional view showing the conventional diamond forming arrangement used in the synthesis of an idiomorphic large diamond.

FIG. 1 shows an arrangement for manufacturing an idiomorphic large diamond single crystal by a known process. Components including a diamond seed crystal 1, a solvent metal 2, and a carbon source 3 are arranged in layers in a cylindrical heater 5 interposing a pressure medium 4 made of, for example, NaCl, Al$_2$O$_3$, MgO or hexagonal-BN, between the heater and the components. Powder of such a material is shaped by pressing to form, for example, a column. When NaCl is used, powder having a cube shape is pressed at $2 \times 10^3$ to $5 \times 10^3$ kg/cm$^2$. When Al$_2$O$_3$ or MgO is used, a mixture of the powder thereof having an irregular form and a binder is shaped by START pressing at $2 \times 10^3$ to $5 \times 10^3$ kg/cm$^2$, calcined to provide a material having 10 to 30% of pores and then it is shaped by machining the thus obtained product. When hexagonal-BN is used the shaping is conducted by pressing the powder thereof having an irregular form at $2 \times 10^3$ to $5 \times 10^3$ kg/cm$^2$ and then calcining the thus obtained products.

In this case, in order to use the temperature gradient naturally formed in the arrangement in the axial direction (A—A'), the carbon source is arranged at the portion of the higher temperature, generally, at the central portion (in the direction of the axis A—A') and the seed crystal at the portion of the lower temperature in this arrangement, generally, at the portion apart from the center. These are arranged in an outer pressure medium cylinder 6 made of, for example, pyrophylite, etc., which is housed in a superhigh pressure and temperature device. After being pressurized up to the predetermined pressure, they are heated by the heater 5.

Then, a temperature difference occurs between the carbon source and the seed crystal due to heat conduction at ends of the arrangement, causing carbon atoms to be migrated from the carbon source to the seed crystal to become a diamond and grow on the seed crystal. The growing diamond 7 continues to grow holding the same orientation as that of the face of seed crystal in contact with the solvent metal. That is, if the face of seed crystal is the face having index of a plane (100), the top face of growing diamond 7 is (100), and if the face of the seed crystal is (111) the top face is (111) (conventional methods are disclosed in, for example, *The Journal of Physical Chemistry*, Vol. 76, No. 12, 1971, pp 1833–1837).

The surface structure of the above-described shaped pressure medium changes to form a surface comprising curvilinear convexes (protrusions) and cavities due to deforming of each particle of the pressure medium under a high pressure (about 45 to 65 Kb) and a high temperature (about 1300° to 1600° C. for producing a diamond crystal. When NaCl is used particles are broken under the high pressure but it grows to form larger particles, and since the surface is contacted with a solvent metal (a molten metal) the surface structure of the NaCl changes also under the effect of the presence of the solvent metal to form a more curvilinear convex-cavity.

Usually, in a conventional manufacturing process, a solvent metal having a diameter larger than that of the growing diamond is used, so that an idiomorphic diamond having smooth surfaces may be obtained. This invention has been derived from the finding that, if the diameter of solvent metal is limited to less than the size of the idiomorphic diamond crystal which could be obtained at those conditions, i.e., the pressure, temperature and the carbon concentration in the metal, the diamond obtained has the same outside profile as that of the solvent metal, and has outer surfaces presenting a novel and industrially useful surface condition. In other words, if the growth of the diamond crystal is suppressed due to the insufficient size of the solvent metal in the direction perpendicular to the direction of the temperature gradient (the direction of axis A—A') a rough surface with irregularities forms at the portion where the crystal growth is suppressed.

Figure 19:
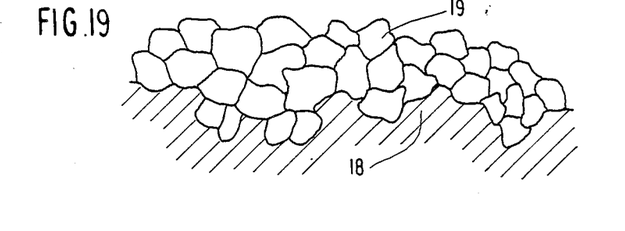
FIG. 19 is a schematic view of a part of a cross-section of a diamond crystal in which growth is suppressed by a pressure medium in accordance with the present invention.
Figure 20:
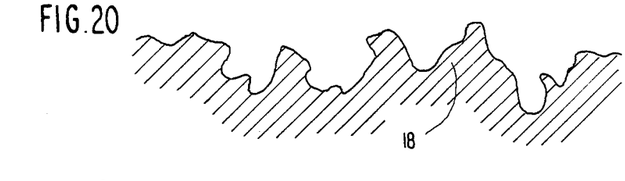
FIG. 20 is a schematic view of a part of a cross-section of a diamond crystal shown in FIG. 19.

FIG. 19 shows a schematic view of a cross-section of a diamond crystal in which the crystal has been grown until it reaches (contacts) the pressure medium and thereby the growth is suppressed (stopped) at the surface of the pressure medium. As can be seen in FIG. 19, the surface of the diamond crystal 18 is in close (tight) contact with the surface of the pressure medium 19. Thus the surface structure of the pressure medium comprised of curvilinear convexes (protrusions) and cavities is transferred to the diamond crystal surface to form a continuous irregular rough surface comprising curvilinear convexes (protrusions) and cavities as can be seen in FIG. 20. In other words, the rough surface structure of the crystal corresponds to the pressure medium surface structure formed under the conditions for producing the diamond crystal. Thus, the rough surface is not formed by etching the surface crystallographically, and is not affected by the crystal characteristics of diamond. Further, the diamond crystal of the present invention can be obtained without using boron. The rough surfaces of the present invention do not have crystallographical characteristics such as trigons, tetragons, flat bottom, point bottom and terraced surfaces because the rough surface is not formed by etching.

Figure 21A:
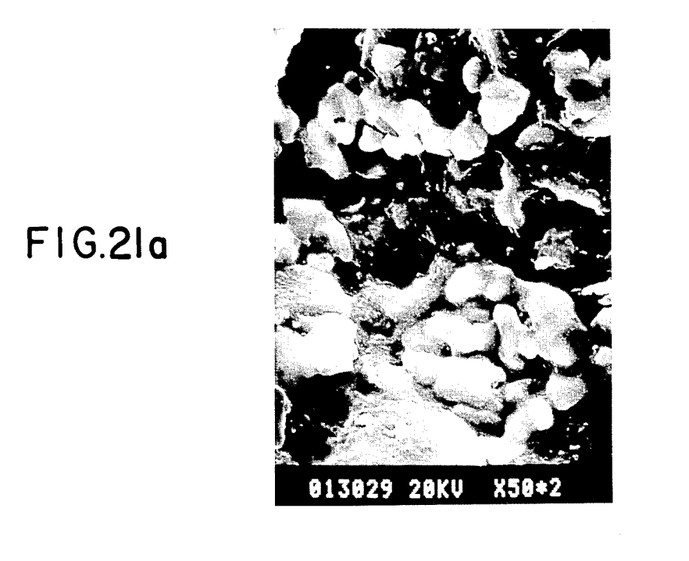
FIGS. 21a and b are photographs of the surface of the diamond crystal of the present invention.
Figure 21B:
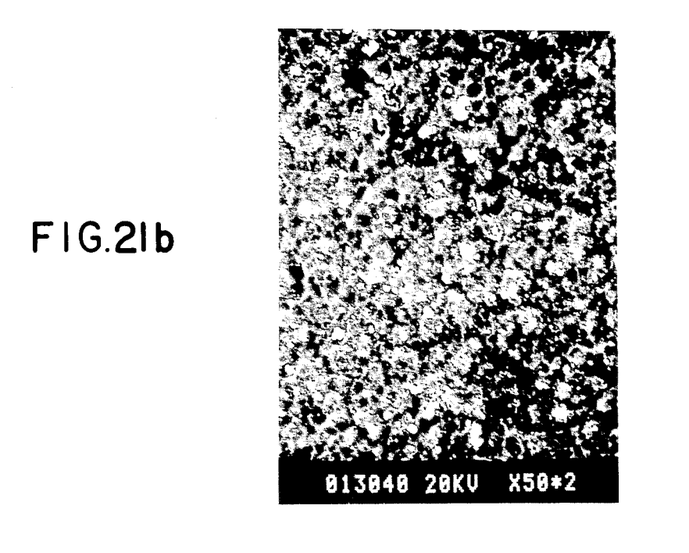

FIG. 21-*a* and FIG. 21-*b* show photographs (magnification: 5,000) of surfaces of diamond crystal produced by using NaCl and Al$_2$O$_3$, respectively, as pressure medium. FIG. 20 is a schematic view drawn by observing the photograph of FIG. 21-*a*, and FIG. 21-*a* is a photograph of the surface of the diamond crystal produced in Example 1 shown hereinafter.

Therefore, to obtain a rough surface at least at a part of the surface of the diamond it is necessary to make at least a part of the diamond crystal grow until the crystal reaches the end portion (side surface) of the solvent metal in the direction perpendicular to the axis A—A'. Thus the crystal growth is suppressed and a rough surface forms at that portion.

It is difficult to express the irregular state of the rough surface quantitatively, but it may be defined optically as an irregular state by which light is diffusibly reflected. The surface has a surface texture having a macro projection value (by ASTM) of not more than about 0.5 mm, usually, not more than 0.1 mm.

The shape of the diamond single crystal of the present invention is not limited to a special shape. The diamond may have a variety of cross sections in the direction perpendicular to the axis A—A', such as circle, a polygon, such as triangle, tetragon, or special form including star-shape, etc. as shown in FIGS. 10 to 13. The polygonal cross section may be such that at least one of angles forms a circular arc. It is preferable that the length (in the direction of the axis A—A') is longer than the diameter of the cross section D (a cross section at the position where the crystal has the rough surface), more preferably $l \geq 1.6D$. As the diameter D in the cases of FIGS. 11 to 13, the diameters for circles converted from the cross section area are used, which is referred to as "equivalent diameter" and can be calculated by the following equation:

$$D = \sqrt{\frac{4}{\pi} S}$$

where S=cross-sectional area.

(Hereinafter "equivalent diameter" refers to both "diameter" and "equivalent diameter".)

It is preferable that the length of the crystal is at least 1 mm.

For obtaining a diamond crystal having a predetermined shape, for example, as shown in FIGS. 10, 11, 12 or 13, solvent metal having the same shape of the cross section as that of the aimed, predetermined shape is used. In such a case a seed crystal should be put at the center of the cross section of the end of the solvent metal where it contacts with the seed crystal.

For forming a diamond crystal having a rough surface only at a part of the side surface of the crystal, a solvent metal having a shape such that the crystal growth is suppressed only at a part of the side surface of the crystal is used, or the seed is placed at a position other than or apart from the center.

Figure 2:
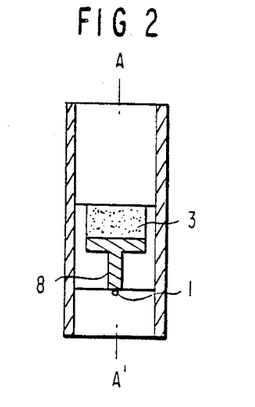
FIGS. 2 and 3 are longitudinal sectional views showing an embodiment of the arrangement used in the synthesis of a rodlike diamond according to this invention.
Figure 3:
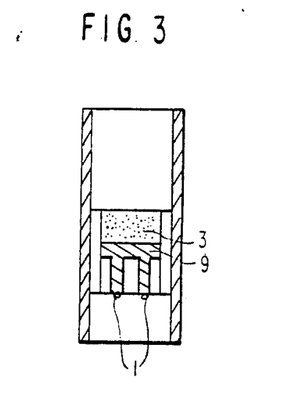

Generally, the solvent metal has a rodlike shape as shown in FIGS. 2 and 3. The length in the direction of the axis is not limited. In order to produce a sufficient concentration of carbon in the metal solvent it is preferred to provide a plate of the metal generally in the shape of a disk, which has a larger cross sectional area (in the direction perpendicular to the axis A—A') than that of the rodlike portion ("leg") at the end (top of Figs.) of the rodlike solvent metal so that it contacts with the carbon source. The ratio of the equivalent diameter of the plate to the equivalent diameter of the rodlike solvent metal is more than 1, preferably from 2 to 5, and the ratio of the equivalent diameter of the plate to the thickness of the plate is usually 2 to 7. Since the contact area of the solvent metal with the carbon source can be made to the wider than that of the end area of the rodlike solvent metal the amount of carbon dissolved into the metal from the source is greater than that of the solvent metal having no such plate.

To manufacture diamond of the present invention, it is important to select the diameter of solvent metal. That is, a solvent metal having a comparatively large equivalent diameter may be used when the diamond growing rate is high. However, when the growing rate is low, it is necessary to reduce the equivalent diameter depending upon the growing rate.

The use of a solvent metal having an equivalent diameter which is too large would cause growth of an idiomorphic diamond with smooth surfaces which does not have the same cross-sectional shape as that of the solvent metal, and a rodlike crystal can not be obtained. There exists a proper equivalent diameter corresponding to a growing rate.

Usually, when the growing rate exceeds 5 mg/H (H: hour), the diamond synthesized includes a great quantity of solvent metal as impurities, which may cause cracks in the diamond attached to the tool support or during operation. For this reason, a growing rate not more than 5 mg/H is preferable. Experiments have indicated that the equivalent diameter of solvent metal to be used in the synthesis should be approximately 4 mm or less. Further experiments have indicated that a diameter no more than 3 mm is proper for a growing rate of 1 to 3 mg/H, and a diameter no more than 4 mm is preferable for a growing rate of more than 3 and up to 5 mg/H.

The solvent metals used include known materials such as Fe, Ni, Co and alloys consisting principally of them. Useful alloy elements include Cr, Mn, Al, Ti, Zr, B, etc.

As the carbon source for the synthesis of diamond (3 in Figs.), known sources such as powder of pure graphite, diamond or a mixture thereof are used.

The conditions for growth of the crystal may be the same as in a conventional method.

The requirements for the synthesis of diamond are that both the seed crystal portion and carbon source are under pressures sand temperatures which permit diamond to be stable and that they are at temperatures at which the metal is able to be in a molten state and which is not less than the eclectic temperature for the solvent metal and carbon used. Good results may be obtained when the temperature difference between the seed crystal portion and the carbon source is kept in the range of 10° C. to 50°C.

The heating temperature is usually from about 1300° to 1600° C., and preferably 1400° to 1500° C., and the pressure is usually from 45 to 65 kb, and preferably 50 to 60 kb. These conditions are maintained until the crystal grows to the predetermined shape. The period of time for growth is generally about 10 to 100 hours. After the crystal growth to the predetermined shape the heating is stopped, the reaction system was cooled to about lower than 500° C., and then the pressure is released. The crystal is then taken out of the arrangement. The position of the seed crystal at the position contacting with the solvent metal is optional so long as at least a part of the crystal can grow until it reaches the side surface (in FIGS. 2 and 3 parallel to the axis A—A') of the solvent metal. Generally, the seed crystal is placed at the center of the cross sectional area of the solvent metal at the contacting position to obtain a crystal of which all side surfaces have a rough surface, in other words, to obtain a crystal of which crystal growth is suppressed at all side surface.

The seed crystal face which contacts with the solvent metal may have a plane index of (1,0,0), (1,1,1) or (1,0,1). However, two or more faces of a crystal may be contacted with the solvent metal. In this case the top face of the crystal is comprised of the same two or more faces to form an edge or edges.

In the present invention the face of the side surface may be controlled by selecting the placing position of sides of the seed crystal with respect to the mutual relationship with the sides of the cross sectional shape of the end of the rodlike solvent metal.

Figure 4:
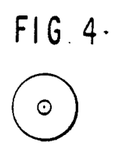
FIGS. 4, 5 and 6 are top plan views showing the shape of solvent metal used in FIG. 2.
Figures 10A, 10B:
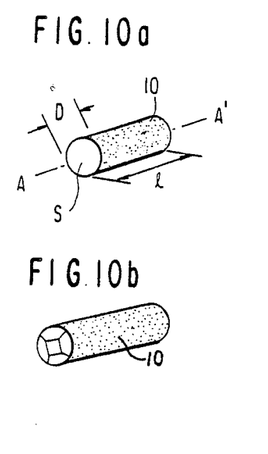

FIG. 2 shows an embodiment of this invention in which one cylindrical diamond single crystal is synthesized. In such a case, a solvent metal 8 which has been formed to a cylindrical shape is used. FIG. 4 is the top plan view of the solvent metal. The diamond forming arrangement is charged into a superhigh pressure and temperature device to pressurise up to a predetermined pressure and to heat it to a predetermined temperature. The high pressure and the high temperature are held for at least a period of time until the growing diamond crystal reaches the side surface of the solvent metal. That is, the conditions are maintained until the growing diamond crystal reaches the contact surface of the solvent metal with the pressure medium. Cylindrical (rodlike) diamond crystals as shown in FIGS. 10-a and b are obtained when the conditions are maintained for a sufficient period of time. The side surfaces 10 of these cylindrical diamond crystals are rough.

Figure 5:
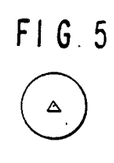
Figure 6:
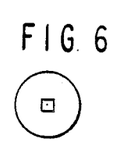
Figure 7:
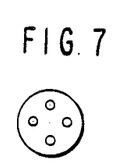
FIGS. 7, 8 and 9 are top plan views showing the shape of solvent metal used in FIG. 3.
Figure 8:
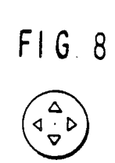
Figure 9:
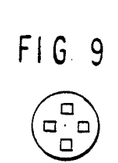
Figure 11:
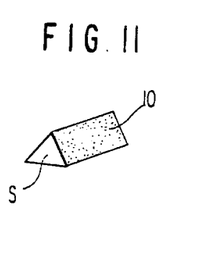
Figure 12:
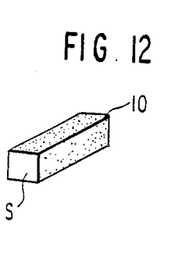
Figure 13:
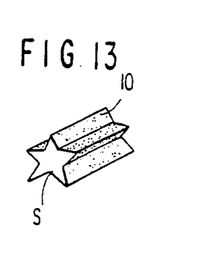

As shown in FIGS. 10, 11, 12 and 13, a rodlike diamond single crystal according to this invention is allotromorphic. It may have an optional cross section such as a circular, triangular, polygonal, or star-shaped cross section. The dotted side surfaces 10 in the figures represent the irregular condition on surfaces like ground glass. Rodlike diamonds having a triangular or tetragonal cross section as shown in FIGS. 11 and 12 may be synthesized by the use of solvent metal having a shape as shown in FIGS. 5 and 6. The longitudinal sectional views of these shapes are the same as FIG. 2. FIG. 3 shows the case where a plurality of rodlike diamonds are synthesized at a time. In this case, a solvent metal 9 having a form which has a top plan view as shown in FIGS. 7, 8 or 9 is preferably used.

In some cases, the end of the thus obtained crystal does not form a plane surface as shown in FIGS. 10-a, 11–13, but forms a convex surface as shown in FIG. 10-b.

The diamond single crystal of this invention can be synthesized with the orientation previously selected toward the longitudinal direction (direction of the axis A—A'), so that the necessity for selecting the orientation as mentioned above may be eliminated, and the orientation suited to tools may be easily determined. In addition, it has an advantage that, when attached to a tool support by soldering or sintering, it has an adhesive strength higher than that of natural diamond having comparatively smooth surfaces because of the larger surface area of the diamond of the present invention due to a surface having irregularities like ground glass so that the chances of the diamonds falling off of the tool support during use are greatly reduced.

According to the present invention a rodlike diamond single crystal which has the same cross-section in the shape and size thereof, throughout the longitudinal direction of the crystal at which the side surface of the crystal is rough can be obtained.

Figure 22A:
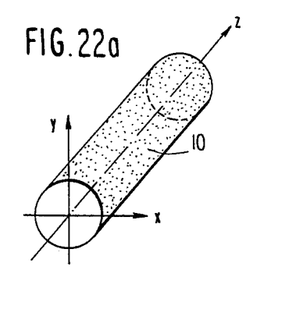
Figure 22B:
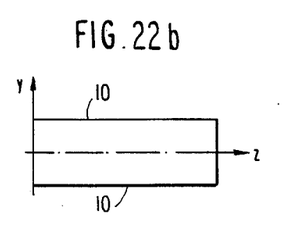
Figure 22C:
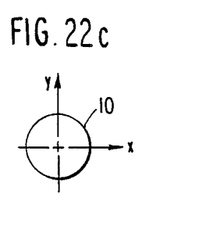
Figure 23A:
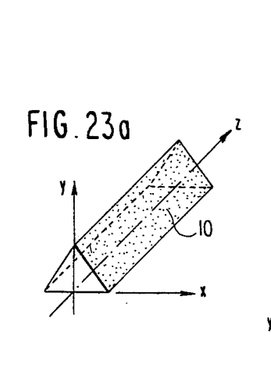
Figure 23B:
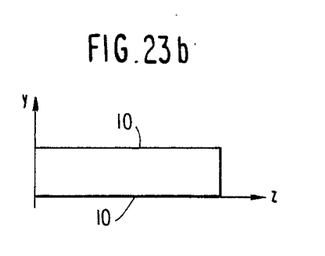
Figure 23C:
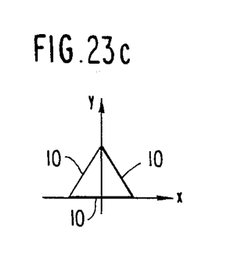
Figure 24A:
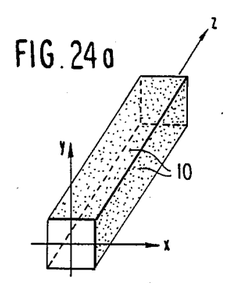
Figure 24B:
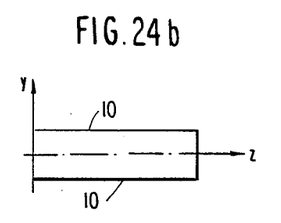
Figure 24C:
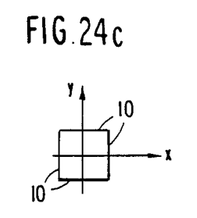
Figure 25A:
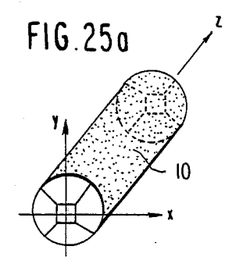
Figure 25B:
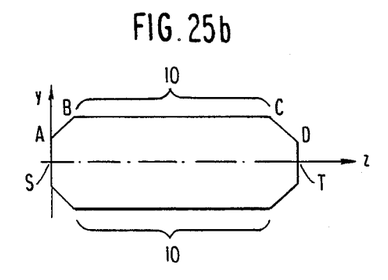
Figure 25C:
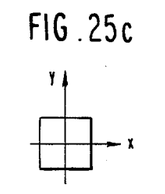
Figure 25D:
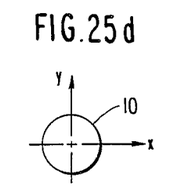

FIGS. 22-a, 23-a, 24-a and 25-a are schematic illustrations on x-y-z axes, corresponding to diamond crystals shown in FIGS. 10a, 11, 12, and 10b, respectively. FIGS. 22-b, 23-b, 24-b and 25-b are y-z cross-sectional views of FIGS. 22-a, 23-a, 24-a and 25-a, respectively. FIGS. 22-c, 23-c, and 24-c are y-x cross sectional views at any position on the z axis of FIGS. 22-b, 23-b, and 24-b, respectively. FIG. 25-c is a x-y cross sectional view at any position between A and B or between C and D on the Z axis of FIG. 25-b. FIG. 25-d is a x-y cross-sectional view at any position between B and C on the z axis of FIG. 25-b. In FIG. 25-b, S shows the plane where the seed having a plane index of (1,0,0) was placed, and T shows the top of the diamond crystal having also a plane index of (1,0,0).

Figure 16A:
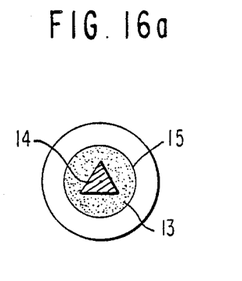
FIGS. 16 and 17 are schematic illustrations showing a dresser of this invention; (a) being a top plan view thereof, and (b) a longitudinal sectional view, respectively.
Figure 16B:
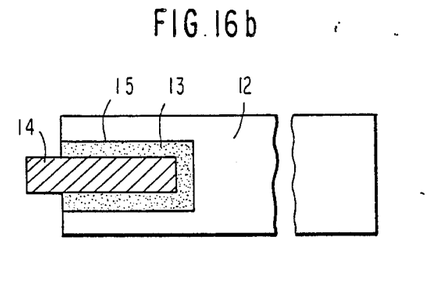
Figure 17A:
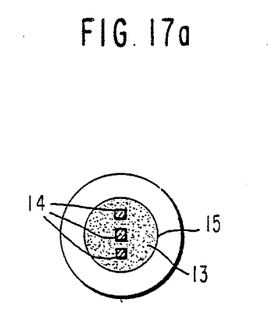
Figure 17B:
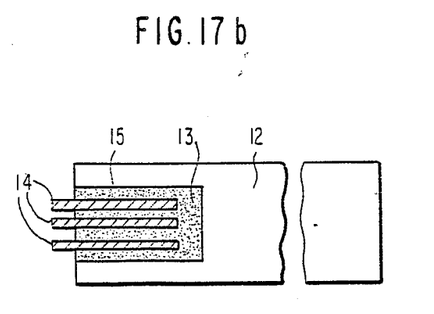

Diamond dressers according to this invention are formed as shown, for example, in FIGS. 16 and 17, by joining an artificial rodlike diamond 14 to a support 12 using a cementing material 13. In joining, an artificial rodlike diamond or diamonds 14 are embedded in a recess 15 provided at the end of the support 12 together with a cementing material 13 such as soldering material, powder sintering material, etc., and joined to the support 12 by heating to 800° to 1000° C. FIG. 16 shows a dresser using a single diamond, and FIG. 17 a dresser using a plurality of diamonds.

Figure 18:
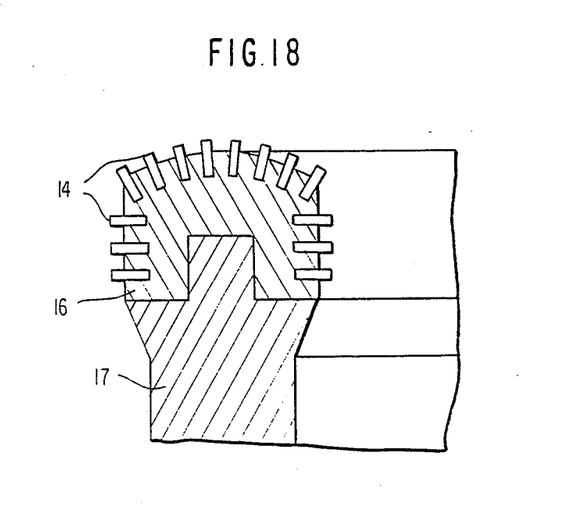
FIG. 18 is a sectional view showing a part of a bit of this invention.

As shown in FIG. 18 a diamond bit according to this invention comprises rodlike synthetic diamonds 14 plated in a ring-shaped sintered matrix 16 being attached to a bit body 17, and joined to the bit body 17 through heat treatment using a soldering material or metal powder. To increase further the adhering strength, the surfaces of said diamonds 14 may be plated with titanium, nickel, etc.

In the dressers and bits according to this invention as mentioned above, the diamonds have a sufficient length preferably such that $l \geqq 1.6D$, and, in the case of polygonal diamonds, have long edges over the length, which permits the diamonds to be used to the last extremity resulting in a reduction in costs.

In addition, since rodlike synthetic diamonds planted project from the tool body, the edges forming knives are always held in a sharp condition even when the wear has progressed to such an extent that only a short portion of the diamonds project beyond the tool body, so that the sharpness of tool will not be reduced.

Furthermore, since diamonds of this invention can be embedded deep enough in tools because of their large length, and since they have an increased adhering strength because of their large surface area due to irregular faces, they are much less likely to fall off the support during use. In addition, metal plating treatment may be easily applied to them because of their rough surfaces. Further, since the orientation of synthetic diamonds is determined at the time of synthesis, it requires no skill to determine the orientation, and it is possible to easily find the orientation in which superior resistance to wear is ensured.

The present invention may be more fully understood from the following examples. However, the scope of the invention is not limited to these examples.

EXAMPLE 1

The diamond forming arrangement as shown in FIG. 2 was used. The seed crystal 1 was a synthetic diamond of 30/40 mesh. As the face in contact with the solvent metal, the face (100) was selected. The solvent metal 8 was an alloy of 58 Fe—42 Ni which was worked to a shape having a circular leg as shown in FIG. 4. The leg was 2 mm in diameter and 4 mm long, and the top disk was 7 mm in diameter and 1 mm thick. The carbon source 3 was a mixture of 160 mg of graphite powder for spectrochemical analysis and 240 mg of synthetic diamond powder of 325/400 mesh pressed to a disk 7 mm in diameter and 4 mm thick, which was placed on said top disk. These were arranged in a pressure medium 4 of sodium chloride, and a diamond forming arrangement was formed using a cylindrical graphite heater 5 and a pyrophylite pressure medium 6. The arrangement was pressurized up to 54 Kb at which diamond can remain stable using a superhigh pressure and temperature device. The heater 5 was used to hold the temperature at 1420° C. for 20 hours. Releasing temperature and pressure in this order, a cylindrical synthetic diamond 2 mm in diameter and about 3.5 mm long was obtained. The diamond weighed about 30 mg and was an opaque crystal having irregular outside peripheral surfaces like ground glass. It was found through the identification of the orientation of the crystal using the Laue method that the top of the cylinder was (100) the same as with the seed crystal.

EXAMPLE 2

The solvent metal used was an alloy of Fe—5 Al having a leg with regular triangular cross section with 2 mm sides, as shown in FIG. 5. The face of the seed crystal selected for contact with the solvent metal was the face (111). The arrangement was held under 56 Kb and 1480° C. for 15 hours. The other conditions were the same as in Example 1. A rodlike diamond having a triangular cross section as shown in FIG. 11 was obtained. It was about 3 mm long, and weighed about 15 mg, having opaque and irregular outer surfaces. It was found by means of the Laue method that the top of the triangular prism was (111).

EXAMPLE 3

The arrangement as shown in FIG. 3 was used. The solvent metal 9 was pure Ni. Four square legs each of 2 mm sides and 5.5 mm length were formed, and a disk of 7 mm diameter and 1 mm thickness was placed on them as shown in FIG. 9. On the bottom of each leg, a diamond of 30/40 mesh was arranged as the seed crystal 1. Two of them took the face (100) as the seed crystal face, and the others (111). The arrangement was held under 56 Kb and 1400° C. for 25 hours. The other conditions were the same as in Example 1. Four rodlike diamonds having a square cross section as shown in FIG. 12 were obtained. Two of the four were about 5 mm long, and the other two about 3.5 mm long. Each of them weighed about 70 mg or about 50 mg. The identification of the orientation of crystals indicated that the top faces of the longer crystals were (100), and those of the shorter ones (111).

EXAMPLE 1

In the same way as in the Example 2, a rodlike diamond of about 100 mg having a triangular cross section was synthesized. The diamond was embedded in the recess 15 having a 6 mm diameter provided in a tool support 12 having a 10 mm diameter together with silver solder powder as in FIG. 16, and soldered to the support by heating to 900° C. to make a dresser. When used in dressing a SiC grinding wheel, the dresser could be used without losing its sharpness until the portion projecting from the tool support had been worn out.

EXAMPLE 5

In the same way as in the Example 1, rodlike diamonds having a circular cross section were synthesized. Using these, a core bit of 46 mm outside diameter was made as shown in FIG. 18. With this core bit, granite having a compressive strength of about 1500 kg/mm$^2$ was drilled at 250 rpm and at a drilling speed of 5 cm/min. A bit using natural diamonds decreased in drilling speed and wore out when it had drilled a distance of 20 m, while the bit using the rodlike diamonds of this invention wore out when it had drilled a distance of about 28 m, a displaying a performance 1.4 times that of the former.

While the invention has been described in detail and with reference to specific embodiments thereof, it will be apparent to one skilled in the art that various changes and modifications can be made therein without departing from the spirit and scope thereof.

What is claimed is:

1. An artificial diamond single crystal, at least a part of a surface of the crystal having a rough surface which diffusibly reflects light which is formed by suppressing crystal growth at that surface, and wherein said diamond single crystal is obtained by a process consisting essentially of:

providing a diamond synthesis reaction system comprised of a reaction chamber housing having positioned therein a carbon source and a solvent metal arranged in contact with the said carbon source, said reaction system being arranged in a pressure medium;

providing a seed crystal in the reaction chamber;

providing temperatures of from about 1300° to 1600° C. and pressure of from about 50 to 60 Kb in the reaction chamber which permit diamond to be maintained thermodynamically stable in the reaction chamber housing;

heating the reaction chamber to provide a temperature gradient in such a way that a portion of the solvent metal in contact with the carbon source is higher in temperature than a portion of the solvent metal in contact with the seed crystal so as to migrate the carbon from the higher temperature portion to the lower temperature portion using the solvent metal as a medium; and allowing the carbon to precipitate and grow as a diamond on the seed crystal due to the difference in solubility caused by the temperature gradient in the reaction chamber housing;

the crystal growth being maintained for about 10 to 100 hours until the crystal growth in the reaction chamber housing in at least one direction perpendicular to the direction of the temperature gradient reaches the contact surface of the solvent metal with the pressure medium having an irregular rough surface and thereby the crystal growth is suppressed at the surface of the pressure medium to thereby form an irregular rough surface on the crystal.

2. A diamond single crystal as claimed in claim 1, wherein the crystal has a length larger than the equivalent diameter of the cross section perpendicular to the longitudinal direction of the crystal.

3. A diamond single crystal as claimed in claim 1, wherein the crystal has a length of more than 1.5 equivalent diameters of the cross section perpendicular to the longitudinal direction of the crystal.

4. A diamond single crystal as claimed in claim 1, wherein the crystal has a length greater than 1 mm.

5. A diamond single crystal as claimed in claim 1, wherein the cross section of the crystal perpendicular to the longitudinal direction of the crystal has the shape of a circle or a polygon.

6. A diamond single crystal as claimed in claim 1, wherein the rough surface has a surface texture having a macro projection value of not more than 0.5 mm.

7. A diamond single crystal as claimed in claim 6, wherein the rough surface has a surface texture having a macro projection value of not more than 0.1 mm.

8. A diamond single crystal according to claim 1, wherein said pressure medium is comprised of a material selected from the group consisting of NaCl, $Al_2O_3$, MgO and hexagonal-BN.

9. A diamond single crystal according to claim 1, wherein said cross section is a polygonal cross section wherein at least one of the angles forms a circular arc.

10. A diamond single crystal according to claim 1, wherein said cross section is a triangle, or tetragon, or a star shape.

11. A diamond single crystal as claimed in claim 1, wherein the top face of the crystal has an index of a plane (100), (101) or (111).

12. A diamond single crystal as claimed in claim 1, wherein the rough surface comprises continuous irregular curvilinear convexes and cavities corresponding to the pressure medium surface structure formed under the conditions for producing the diamond crystal.

13. A diamond single crystal as claimed in claim 1, wherein the single crystal has the same cross-section in the shape and size thereof throughout the longitudinal direction of the crystal at which the side surface of the crystal is rough.

14. A diamond single crystal as claimed in claim 1, wherein said rough surface is formed not by etching the surface crystallographically.

15. A diamond single crystal as claimed in claim 1, wherein said crystal does not contain boron.

* * * * *